(12) United States Patent
Huang et al.

(10) Patent No.: US 11,908,865 B2
(45) Date of Patent: Feb. 20, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Da Huang, Shanghai (CN); Yao Qi Dong, Shanghai (CN); Xiaowan Dai, Shanghai (CN); Zhen Tian, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 129 days.

(21) Appl. No.: 17/576,876

(22) Filed: Jan. 14, 2022

(65) Prior Publication Data
US 2022/0231024 A1 Jul. 21, 2022

(30) Foreign Application Priority Data
Jan. 15, 2021 (CN) .......................... 202110056291.6

(51) Int. Cl.
*H01L 27/092* (2006.01)
*H01L 21/8238* (2006.01)
(52) U.S. Cl.
CPC .. *H01L 27/0924* (2013.01); *H01L 21/823842* (2013.01); *H01L 21/823878* (2013.01)

(58) Field of Classification Search
CPC ........ H01L 27/0924; H01L 21/823842; H01L 21/823878; H01L 21/823481; H01L 21/82345; H01L 21/823821; H01L 27/0886; H01L 29/66545; H01L 21/823431; H01L 29/66803; H01L 29/785
See application file for complete search history.

(56) References Cited

U.S. PATENT DOCUMENTS

2017/0278928 A1* 9/2017 Tung .................... H01L 27/0886
2019/0259760 A1* 8/2019 Liao ..................... H01L 27/0924

* cited by examiner

*Primary Examiner* — Fernando L Toledo
*Assistant Examiner* — Adam S Bowen
(74) *Attorney, Agent, or Firm* — Anova Law Group, PLLC (57) ABSTRACT

A semiconductor structure and a fabrication method of the semiconductor structure are provided. The semiconductor structure includes a substrate. The substrate includes a first region, a second region, and an isolation region between the first region and the second region. The semiconductor structure also includes a first fin, a second fin and a third fin disposed over the first region, the second region, and the isolation region, respectively. Further, the semiconductor structure includes a gate structure. The gate structure includes a first work function layer over the first region and a first portion of the isolation region, and a second work function layer over the second region and a second portion of the isolation region. An interface where the first work function layer is in contact with the second work function layer is located over a top surface of the third fin.

20 Claims, 5 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 202110056291.6, filed on Jan. 15, 2021, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the development of integrated circuit manufacturing technology, the integration degree of the integrated circuit increases continuously, and the feature size of the integrated circuit decreases continuously. With the development of semiconductor devices to higher density and smaller size, complementary metal oxide semiconductor (CMOS) device is an advanced logic integrated circuit with extremely low power consumption and desired noise immunity. The performance of the CMOS transistor directly affects the overall performance of the integrated circuit. Among various parameters of the CMOS transistor, a threshold voltage (Vt) is an important control parameter of the CMOS transistor.

To adjust the threshold voltage of the transistor, a work function layer is disposed between a gate dielectric layer and a gate during the formation of the transistor. The work function layer is capable of adjusting a work function of the transistor, thereby adjusting the threshold voltage of the transistor. Different CMOS transistors put different requirements on the threshold voltage.

However, the performance of the semiconductor structure formed by the existing method is poor. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate. The substrate includes a first region, a second region, and an isolation region disposed between the first region and the second region. The semiconductor structure also includes a first fin disposed over the first region, a second fin disposed over the second region, and a third fin disposed over the isolation region. Further, the semiconductor structure includes a gate structure across the first fin, the second fin and the third fin. The gate structure includes a first work function layer disposed over the first region and a first portion of the isolation region, and a second work function layer disposed over the second region and a second portion of the isolation region. An interface where the first work function layer is in contact with the second work function layer is located over a top surface of the third fin.

Optionally, the first fin close to the isolation region and the third fin are spaced apart by a first distance, and the second fin close to the isolation region and the third fin 213 are spaced apart by a second distance, where the first distance is equal to the second distance.

Optionally, a top surface of the first work function layer is above a top surface of each of the first fin, the second fin, and the third fin. The top surface of the first work function layer is higher than the top surface of each of the first fin, the second fin, and the third fin in a range of approximately 10 nm-30 nm.

Optionally, a top surface of the second work function layer is above a top surface of each of the first fin, the second fin, and the third fin. The top surface of the second work function layer is higher than the top surface of each of the first fin, the second fin, and the third fin in a range of approximately 10 nm-30 nm.

Optionally, a central axis of the third fin coincides with the interface.

Optionally, a work function type of the first work function layer is different from a work function type of the second work function layer. The first work function layer is made of a material including one or more of TiN, TaN and TiAl. The second work function layer is made of a material including one or more of TiN, TaN and TiAl.

Optionally, the gate structure further includes a first conductive layer disposed over the first work function layer, and a second conductive layer disposed over the second work function layer.

Optionally, the semiconductor structure further includes a first source and drain doped region in the first fin on each side of the first work function layer, and a second source and drain doped region in the second fin on each side of the second work function layer.

Optionally, the semiconductor structure further includes an isolation layer disposed over the substrate. The isolation layer covers a portion of a sidewall surface of each of the first fin, the second fin, and the third fin, and both the first work function layer and the second work function layer are disposed over the isolation layer.

Optionally, the semiconductor structure further includes a dielectric layer disposed over the isolation layer and a high-K dielectric layer. The dielectric layer is disposed on sidewalls of the first fin, the second fin, and the third fin, and exposes top surfaces of the first work function layer and the second work function layer. The dielectric layer contains an opening across the first region, the second region, and the isolation region, the opening exposes a portion of top and sidewall surfaces of each of the first fin, the second fin and the third fin, and the gate structure is disposed in the opening. The high-K dielectric layer is disposed on bottom and sidewall surfaces of the opening. The high-K dielectric layer is located between the first work function layer and each of the first fin and a portion of the third fin, and between the second work function layer and each of the second fin and another portion of the third fin.

Another aspect of the present disclosure includes a fabrication method of a semiconductor structure. The method includes providing a substrate. The substrate includes a first region, a second region, and an isolation region disposed between the first region and the second region. The method also includes forming a first fin, a second fin, and a third fin over the first region, the second region, and the isolation region, respectively. Further, the method includes forming a gate structure across the first fin, the second fin and the third fin. The gate structure includes a first work function layer disposed over the first region and a first portion of the isolation region, and a second work function layer disposed over the second region and a second portion of the isolation region. An interface where the first work function layer is in contact with the second work function layer is located over a top surface of the third fin.

Optionally, before forming the first work function layer and the second work function layer, the method further includes forming an isolation layer covering a portion of a sidewall surface of each of the first fin, the second fin, and the third fin over the substrate; and forming a dielectric layer over the isolation layer. The dielectric layer contains an opening across the first region, the second region, and the isolation region, and the opening exposes a portion of top and sidewall surfaces of each of the first fin, the second fin and the third fin.

Optionally, after forming the first work function layer, the second work function layer is formed, or before forming the first work function layer, the second work function layer is formed.

Optionally, forming the first work function layer and the second work function layer includes: forming a first work function material film in the opening and on a surface of the dielectric layer; planarizing the first work function material film until the surface of the dielectric layer is exposed, to form an initial first work function layer in the opening; removing the initial first work function layer over the second region and the second portion of the isolation region, to form the first work function layer in the opening over the first region and the first portion of the isolation region; forming a second work function material film on a surface of the first work function layer, on the surface of the dielectric layer, and in the opening; and planarizing the second work function material film until the surface of the dielectric layer is exposed, to form the second work function layer in the opening over the second region and the second portion of the isolation region.

Optionally, removing the initial first work function layer over the second region and the second portion of the isolation region includes: forming a first patterned layer on a surface of the initial first work function layer, where the first patterned layer exposes the surface of the initial first work function layer over the second region and the second portion of the isolation region; and using the first patterned layer as a mask, etching the initial first work function layer until surfaces of the second fin and the third fin are exposed, to form the first work function layer.

Optionally, forming the dielectric layer and the opening in the dielectric layer includes: forming a dummy gate structure across the first fin, the second fin and the third fin over the isolation layer; forming the dielectric layer over the isolation layer, where the dielectric layer is disposed on a sidewall surface of the dummy gate structure; and removing the dummy gate structure to form the opening in the dielectric layer.

Optionally, after forming the dummy gate structure and before forming the dielectric layer, the method further includes: forming a first source and drain doped region in the first fin on each side of the dummy gate structure; and forming a second source and drain doped region in the second fin on each side of the dummy gate structure.

Optionally, forming the first source and drain doped region includes: forming a second patterned layer over the substrate, where the second patterned layer covers the second fin and the third fin, and exposes the first fin; etching the first fin using the second patterned layer as a mask, to form a first source and drain opening in the first fin on each side of the dummy gate structure; and forming the first source and drain doped region in the first source and drain opening.

Optionally, forming the second source and drain doped region includes: forming a third patterned layer over the substrate, where the third patterned layer covers the first fin and the third fin, and exposes the second fin; etching the second fin using the third patterned layer as a mask, to form a second source and drain opening in the second fin on each side of the dummy gate structure; and forming the second source and drain doped region in the second source and drain opening.

Optionally, forming the first fin, the second fin and the third fin includes a multiple self-aligned patterning process, or an exposure process using extreme ultraviolet light as a light source.

The disclosed embodiments may have following beneficial effects. In the disclosed semiconductor structure of the present disclosure, the first region and the second region may be configured to form transistors of different conductivity types, respectively. The first fin may be formed over the first region, the second fin may be formed over the second region, and the third fin may be formed over the isolation region. Because the isolation region is located between the first region and the second region, the third fin formed over the isolation region may block the first work function layer from the second work function layer, may reduce the mutual influence between the first work function layer and the second work function layer, thereby maintaining the stability of the threshold voltage of the transistor over the first region and the stability of the threshold voltage of the transistor over the second region.

Further, the first fin close to the isolation region and the third fin may be spaced apart by a first distance, and the second fin close to the isolation region and the third fin may be spaced apart by a second distance, where the first distance may be equal to the second distance. Therefore, the effect of the first work function layer on the second work function layer may be similar to the effect of the second work function layer on the first work function layer, which may facilitate to maintain the stability of the threshold voltage of the transistor over the first region and the stability of the threshold voltage of the transistor over the second region.

Further, the top surface of the first work function layer may be higher than the top surface of each of the first fin, the second fin, and the third fin in a range of approximately 10 nm-30 nm. Therefore, the first work function layer and the second work function layer may have a certain contact area, and the first work function layer may be electrically connected to the second work function layer, to satisfy that the transistor over the first region and the transistor over the second region may form a CMOS device. At the same time, the contact area between the first work function layer and the second work function layer may not be too large, thereby reducing the mutual influence between the first work function layer and the second work function layer, and maintaining the stability of the threshold voltage of the transistor over the first region and the stability of the threshold voltage of the transistor over the second region. Similarly, the top surface of the second work function layer may be higher than the top surface of each of the first fin, the second fin, and the third fin in a range of approximately 10 nm-30 nm, and the meaning may be the same as the first work function layer.

In the disclosed fabrication method of the present disclosure, the first region and the second region may be configured to form transistors of different conductivity types, respectively. The first fin may be formed over the first region, the second fin may be formed over the second region, and the third fin may be formed over the isolation region. Because the isolation region is located between the first region and the second region, the third fin formed over the isolation region may block the first work function layer from the second work function layer, may reduce the mutual influence between the first work function layer and the second work function layer, thereby maintaining the stability of the threshold voltage of the transistor over the first region and the stability of the threshold voltage of the transistor over the second region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The terms "surface" and "on" in the present disclosure are configured to describe the relative positional relationship in space, and are not limited to direct contact.

Figure 1:
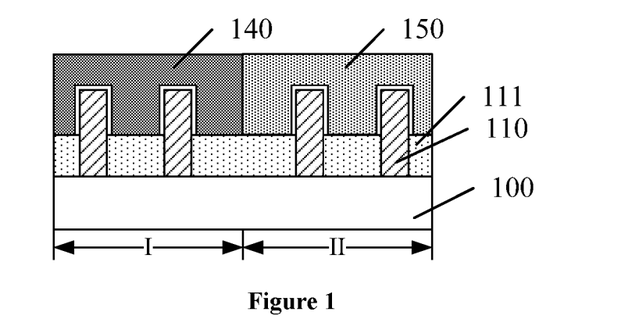
FIGS. 1-2 illustrate a semiconductor structure.
Figure 2:
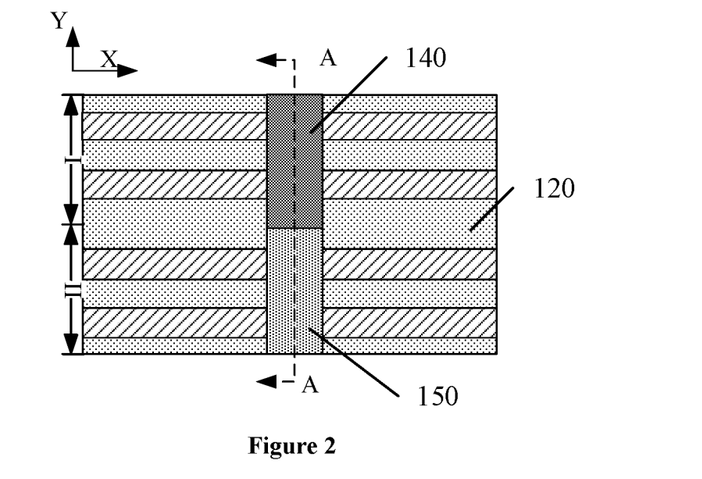

FIGS. 1-2 illustrate a semiconductor structure. FIG. 1 illustrates an A-A sectional view of the semiconductor structure shown in FIG. 1. Referring to FIG. 1 and FIG. 2, the semiconductor structure includes a substrate 100. The substrate 100 includes a first region I and a second region II adjacent to the first region I. A fin 110 is formed on each of the first region I and the second region II. The first region I and the second region II are arranged along a first direction X, and the fin 110 is extended along a second direction Y, where the first direction X is different from the second direction Y. The semiconductor structure also includes an isolation layer 111 disposed over the substrate 100, and the isolation layer 111 covers a portion of a sidewall surface of the fin 110. Moreover, the semiconductor structure includes a dielectric layer 120 disposed over the isolation layer 111. The dielectric layer 120 contains an opening (not shown in the Figure), and the opening exposes a portion of the top surface and the sidewall surface of the fin 110, and is across the first region I and the second region II. Further, the semiconductor structure includes a first work function layer 140 disposed in the opening over the first region I, and a second work function layer 150 disposed in the opening over the second region II. The first work function layer 140 is in contact with the second work function layer 150.

In the above structure, the first region I and the second region II are configured to form transistors with different conductivity types, respectively. The first work function layer 140 is in contact with the second work function layer 150, such that the transistor over the first region I is capable of being electrically connected to the transistors over the second region II.

However, a contact area between the first work function layer 140 and the second work function layer 150 is substantially large, such that atoms of the material of the first work function layer 140 easily diffuse into the second work function layer 150, or atoms of the material of the second work function layer 150 easily diffuse into the first work function layer 140, which causes the threshold voltages of the transistors over the first region I and the second region II to be unstable.

The present disclosure provides a semiconductor structure and a fabrication method of the semiconductor structure. In the disclosed semiconductor structure, a third fin formed over an isolation region may be located between a first fin and a second fin. Therefore, the third fin over the isolation region may block a first work function layer from a second work function layer, and may reduce the mutual influence between the first work function layer and the second work function layer, thereby maintaining the stability of a threshold voltage of a transistor over a first region and the stability of a threshold voltage of a transistor over a second region.

Figure 12:
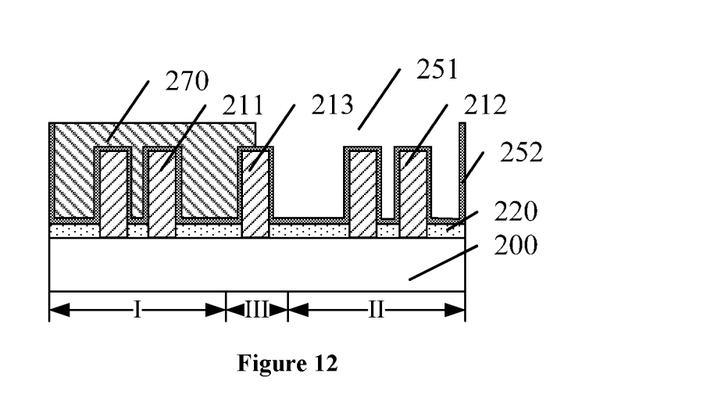
Figure 13:
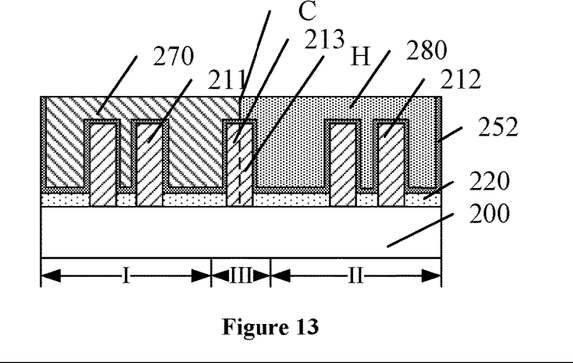
Figure 14:
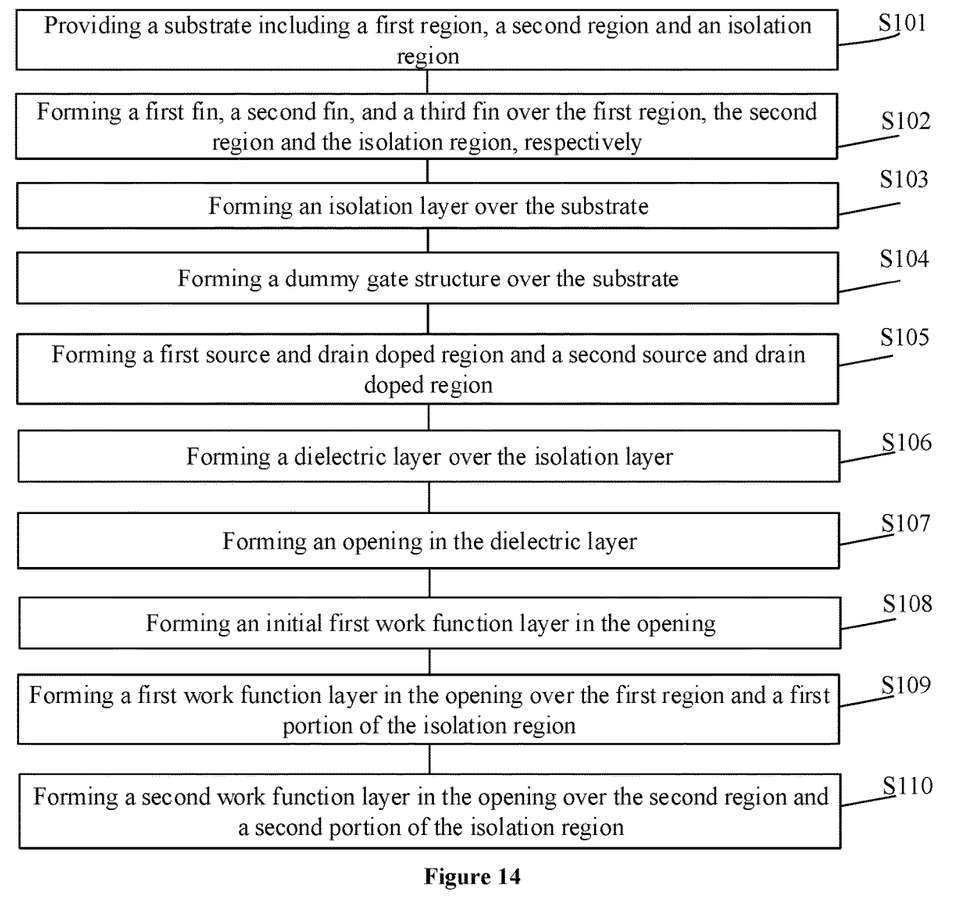
FIG. 14 illustrates a flowchart of an exemplary fabrication method of a semiconductor structure consistent with various disclosed embodiments of the present disclosure.

FIG. 14 illustrates a flowchart of a method for forming a semiconductor structure consistent with various disclosed embodiments of the present disclosure, and FIGS. 3-13 illustrate semiconductor structures corresponding to certain stages of the fabrication method.

Figure 3:
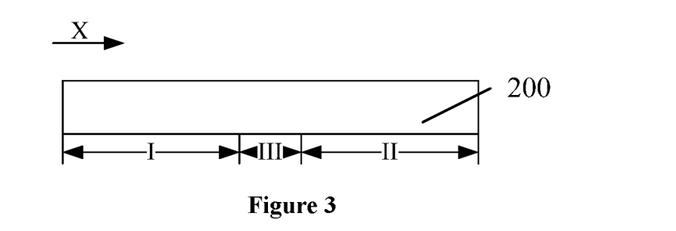
FIGS. 3-13 illustrate semiconductor structures corresponding to certain stages for forming an exemplary semiconductor structure consistent with various disclosed embodiments of the present disclosure.

As shown in FIG. 14, at the beginning of the fabrication method, a substrate including a first region, a second region and an isolation region may be provided (S101). FIG. 3 illustrates a corresponding semiconductor structure.

Referring to FIG. 3, a substrate 200 may be provided. The substrate 200 may include a first region I, a second region II, and an isolation region III disposed between the first region I and the second region II. The first region I, the second region II, and the isolation region III may be arranged along a first direction X.

In one embodiment, the substrate 200 may be made of silicon. In another embodiment, the substrate may be made of a material including silicon carbide, silicon germanium, a multi-component semiconductor material composed of group III-V elements, silicon on insulator (SOI), or germanium on insulator (GOI). The multi-component semiconductor material composed of the group III-V elements may include InP, GaAs, GaP, InAs, InSb, InGaAs, or InGaAsP.

Figure 4:
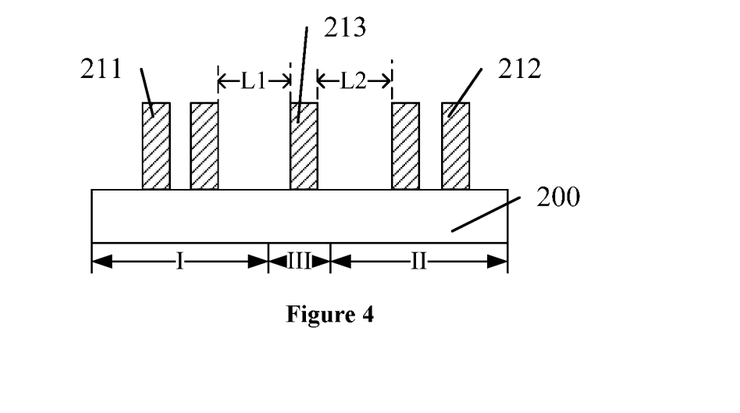
Figure 5:
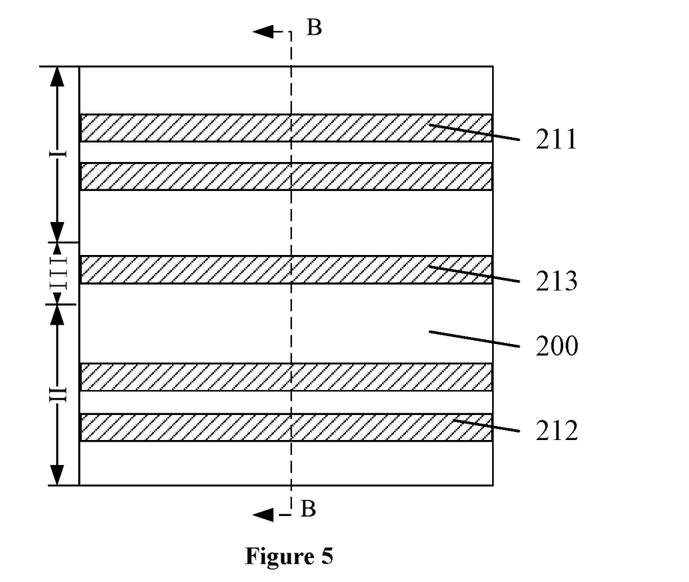

Returning to FIG. 14, after providing the substrate, a first fin, a second fin, and a third fin may be formed (S102). FIGS. 4-5 illustrate a corresponding semiconductor structure.

FIG. 4 illustrates a B-B sectional view of the semiconductor structure shown in FIG. 5. Referring to FIGS. 4-5, a first fin 211 may be formed over the first region I, a second fin 212 may be formed over the second region II, and a third fin 213 may be formed over the isolation region III, respectively. Each of the first fin 211, the second fin 212 and the third fin 213 may be extended along a second direction Y.

In one embodiment, the first fin 211, the second fin 212, and the third fin 213 may be made of a same material, and may be made of silicon. In another embodiment, each of the first fin, the second fin, and the third fin may be made of a material including silicon carbide, silicon germanium, a multi-component semiconductor material composed of group III-V elements, silicon on insulator (SOI), or germanium on insulator (GOI). The multi-component semiconductor material composed of the group III-V elements may include InP, GaAs, GaP, InAs, InSb, InGaAs, or InGaAsP.

Forming the first fin 211, the second fin 212, and the third fin 213 may include a multiple self-aligned patterning process or an exposure process using extreme ultraviolet light as a light source.

In one embodiment, the first fin 211, the second fin 212, and the third fin 213 may be formed over the first region I, the second region II, and the third region III, respectively, by two etching processes. Forming the first fin 211, the second fin 212, and the third fin 213 may include: forming a plurality of fins (not shown in the Figure) over the first region I, the second region II, and the isolation region III, respectively; performing a first etching process to remove a portion of the plurality of fins disposed parallel to the first direction X; and performing a second etching process to remove another portion of the plurality of fins disposed perpendicular to the first direction X.

Next, an isolation layer covering a portion of the sidewalls of the first fin 211, the second fin 212, and the third fin 213 may be formed over the substrate 200, and a dielectric layer may be formed over the isolation layer. The dielectric layer may contain an opening across the first region I, the second region II, and the isolation region III, and the opening may expose a portion of the top surface and the sidewall surface of each of the first fin 211, the second fin 212, and the third fin 213. The detailed process of forming the isolation layer, the dielectric layer, and the opening in the dielectric layer may refer to FIGS. 6-10.

Figure 6:
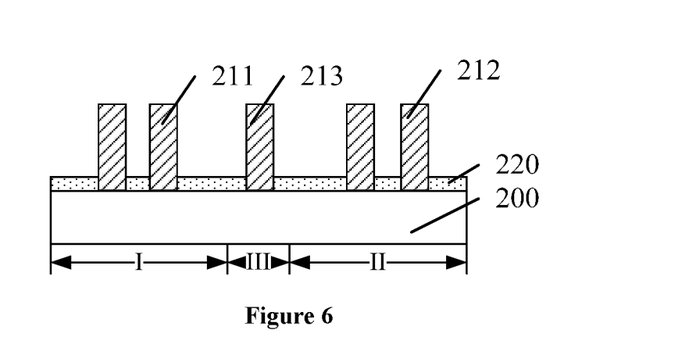

Returning to FIG. 14, after forming the first fin, the second fin, and the third fin, an isolation layer may be formed over the substrate (S103). FIG. 6 illustrates a corresponding semiconductor structure.

Referring to FIG. 6, an isolation layer 220 covering a portion of the sidewalls of the first fin 211, the second fin 212 and the third fin 213 may be formed over the substrate 200. The isolation layer 220 may electrically isolate adjacent fins.

In one embodiment, the isolation layer may be made of silicon oxide. In certain embodiments, the isolation layer may be made of silicon nitride or silicon oxynitride.

Forming the isolation layer 220 may include: forming an isolation structure material layer (not shown in the Figure) covering the first fin 211, the second fin 212, and the third fin 213 over the substrate 200; removing the isolation structure material layer above the top surfaces of the first fin 211, the second fin 212, and the third fin 213; and back-etching the isolation structure material layer to form the isolation layer 220.

Figure 7:
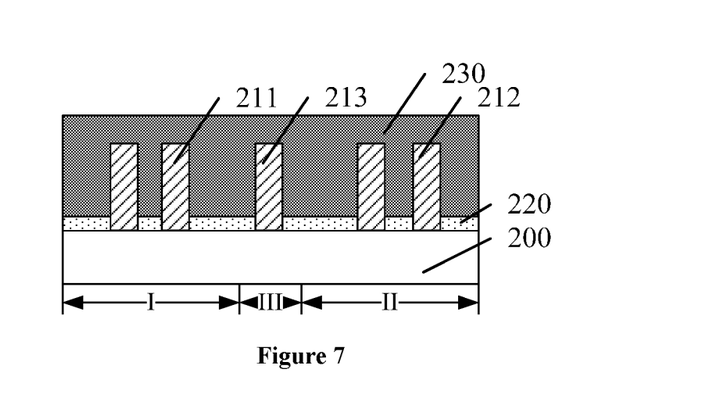

Returning to FIG. 14, after forming the isolation layer, a dummy gate structure may be formed over the substrate (S104). FIG. 7 illustrates a corresponding semiconductor structure.

Referring to FIG. 7, a dummy gate structure 230 across the first fin 211, the second fin 212 and the third fin 213 may be formed over the isolation layer 220. The dummy gate structure 230 may occupy space for the subsequent formation of a gate structure.

The dummy gate structure 230 may include a dummy gate dielectric layer (not shown in the Figure) on a portion of the sidewall surfaces and top surfaces of the first fin 211, the second fin 212 and the third fin 213, and a dummy gate layer on a surface of the dummy gate dielectric layer (not shown in the Figure).

The dummy gate dielectric layer may be made of a material including silicon oxide, and the dummy gate layer may be made of a material including polysilicon.

Figure 8:
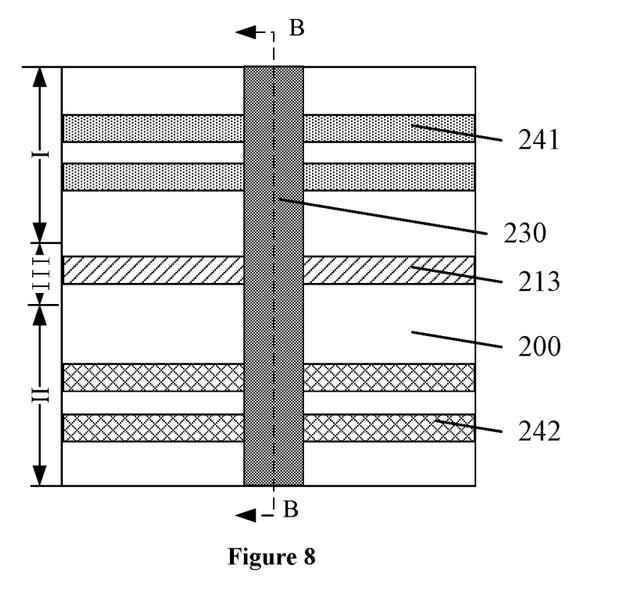

Returning to FIG. 14, after forming the dummy gate structure, a first source and drain doped region and a second source and drain doped region may be formed (S105). FIG. 8 illustrates a corresponding semiconductor structure.

A view direction of FIG. 8 may be the same as a view direction of FIG. 5. Referring to FIG. 8, a first source and drain doped region 241 may be formed in the first fin 211 on each side of the dummy gate structure 230; and a second source and drain doped region 242 may be formed in the second fin 212 on each side of the dummy gate structure 230.

In one embodiment, after the first source and drain doped region 241 is formed, the second source and drain doped region 242 may be formed. In certain embodiments, before the first source and drain doped region is formed, the second source and drain doped region may be formed.

Forming the first source and drain doped region 241 may include: forming a second patterned layer (not shown in the Figure) over the substrate 200, where the second patterned layer may cover the second fin 212 and the third fin 213, and may expose the first fin 211; etching the first fin 211 using the second patterned layer as a mask, to form a first source and drain opening (not shown in the Figure) in the first fin 211 on each side of the dummy gate structure 230; and forming the first source and drain doped region 241 in the first source and drain opening.

Forming the first source and drain doped region 241 in the first source and drain opening may include: epitaxially growing a first epitaxial layer (not shown in the Figure) in the first source and drain opening; and in-situ doping first source and drain ions while epitaxially growing the first epitaxial layer, to form the first source and drain doped region 241.

Forming the second source and drain doped region 242 may include: forming a third patterned layer (not shown in the Figure) over the substrate 200, where the third patterned layer may cover the first fin and the third fin, and may expose the second fin; etching the second fin using the third patterned layer as a mask, to form a second source and drain opening in the second fin on each side of the dummy gate structure; and forming the second source and drain doped region 242 in the second source and drain opening.

Forming the second source and drain doped region 242 in the second source and drain opening may include: epitaxially growing a second epitaxial layer (not shown in the Figure) in the second source and drain opening; and in-situ doping second source and drain ions while epitaxially growing the second epitaxial layer, to form the second source and drain doped region 242.

In one embodiment, the first region and the second region may be configured to form devices of different conductivity types, respectively.

The first source and drain ions may include N-type ions or P-type ions. The second source and drain ions may include N-type ions or P-type ions. The N-type ions may include phosphorous ions, arsenic ions, or antimony ions. The P-type ions may include boron ions, gallium ions, or indium ions.

In one embodiment, the first region I may be configured to form an N-type transistor. The first epitaxial layer may be made of a material including silicon carbide or silicon, and the first source and drain ions may include N-type ions. The second region II may be configured to form a P-type transistor. The second epitaxial layer may be made of a material including silicon germanium or silicon, and the second source and drain ions may include P-type ions.

Figure 9:
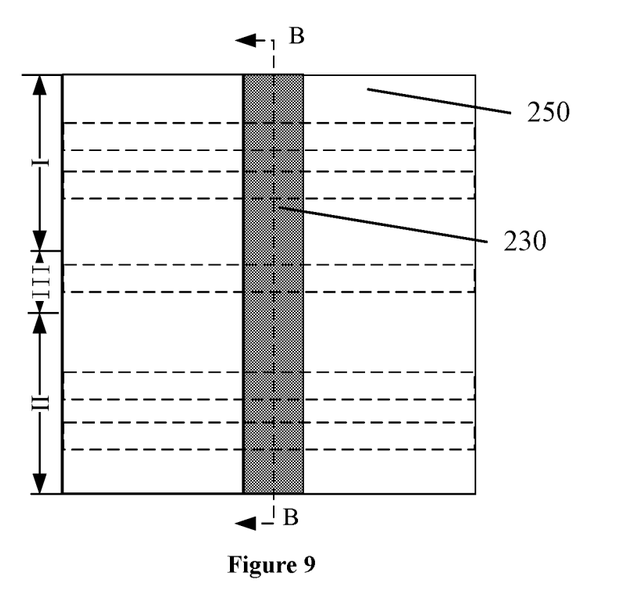

Returning to FIG. 14, after forming the first source and drain doped region and the second source and drain doped region, a dielectric layer may be formed over the isolation layer (S106). FIG. 9 illustrates a corresponding semiconductor structure.

Referring to FIG. 9, a dielectric layer 250 may be formed over the isolation layer 220, and the dielectric layer 250 may be disposed on the sidewall surface of the dummy gate structure 230.

Forming the dielectric layer 250 may include: forming a dielectric material layer (not shown in the Figure) covering the dummy gate structure 230 over the substrate 200, the first fin 211, the second fin 212, and the third fin 213, where an entire surface of the dielectric material layer may be above a top surface of the dummy gate structure 230; and removing the dielectric material layer above the top surface of the dummy gate layer 230, to form the dielectric layer 250.

The dielectric layer 250 may be made of a material including a dielectric material. The dielectric material may include one or more of silicon oxide, silicon nitride, silicon carbide, silicon oxy-carbide, silicon oxy-nitride, aluminum oxide, aluminum nitride, silicon carbo-nitride, and silicon oxy-carbo-nitride. In one embodiment, the dielectric layer 250 may be made of silicon oxide.

Figure 10:
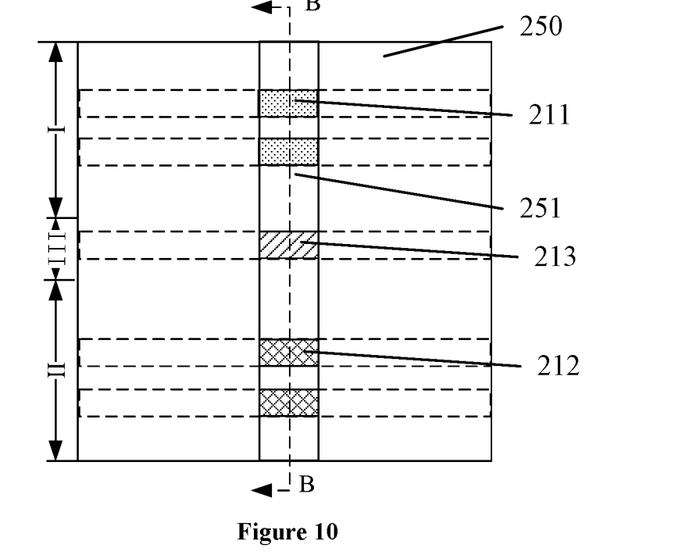

Returning to FIG. 14, after forming the dielectric layer, an opening may be formed in the dielectric layer (S107). FIG. 10 illustrates a corresponding semiconductor structure.

Referring to FIG. 10, the dummy gate structure 230 may be removed, to form an opening 251 in the dielectric layer 250. The opening 251 may provide space for the subsequent formation of the gate structure.

In one embodiment, the opening 251 may expose a portion of the top surface and the sidewall surface of each of the first fin 211, the second fin 212 and the third fin 213.

Removing the dummy gate structure 230 may include one or more of a dry etching process and a wet etching process.

Next, a gate structure across the first fin 211, the second fin 212, and the third fin 213 may be formed. The gate structure may include a first work function layer disposed over the first region I and a portion of the isolation region III, and a second work function layer disposed over the second region II and another portion of the isolation region III. An interface where the first work function layer is in contact with the second work function layer may be disposed over the top surface of the third fin 213. Detailed processes of forming the gate structure may refer to FIGS. 11-13.

In one embodiment, after forming the first work function layer, the second work function layer may be formed. In certain embodiments, before forming the first work function layer, the second work function layer may be formed.

Figure 11:
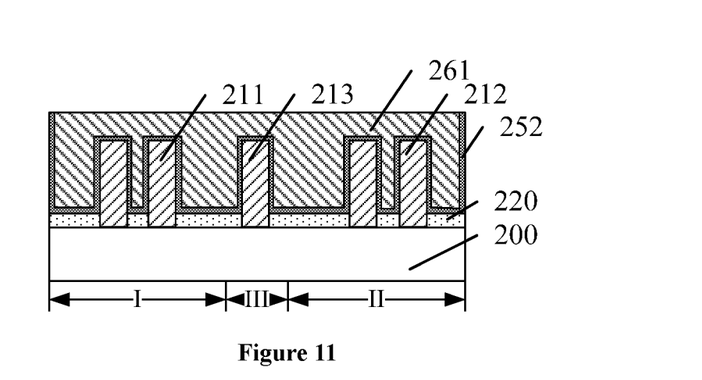

Returning to FIG. 14, after forming the opening, an initial first work function layer may be formed in the opening (S108). FIG. 11 illustrates a corresponding semiconductor structure.

Referring to FIG. 11, a first work function material film (not shown in the Figure) may be formed in the opening 251 and on the surface of the dielectric layer 250. The first work function material film may be planarized until the surface of the dielectric layer 250 is exposed, to form an initial first work function layer 261 in the opening 251.

The initial first work function layer 261 may provide material for the subsequent formation of the first work function layer. The initial first work function layer 261 may be made of a material including one or more of TiN, TaN and TiAl.

In one embodiment, the device over the first region I may be configured to form an N-type device. The initial first work function layer 261 may have a three-layer structure formed by sequentially stacking TiN, TaN, and TiAl layers with different thicknesses. In another embodiment, the initial first work function layer may have a three-layer structure formed by sequentially stacking TaN, TiN, and TiAl layers with different thicknesses.

In certain embodiments, the device over the first region I may be configured to form a P-type device. The initial first work function layer may be made of a material including one or more of TiN, TaN, and TiAl.

In one embodiment, before forming the first work function material film, the method may further include forming a high-K dielectric material film (not shown in the Figure) on the bottom and sidewall surfaces of the opening 251. The first work function material film may be located on the surface of the high-K dielectric material film. The process of planarizing the first work function material film may also planarize the high-K dielectric material film, such that the high-K dielectric material film may form a high-K dielectric layer 252.

The high-K dielectric layer 252 may be made of a material including one or more of hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide, and aluminum oxide. In one embodiment, the high-K dielectric layer 252 may be made of hafnium oxide.

Returning to FIG. 14, after forming the initial first work function layer, a first work function layer may be formed in the opening over the first region and a first portion of the isolation region (S109). FIG. 12 illustrates a corresponding semiconductor structure.

Referring to FIG. 12, the initial first work function layer 261 over the second region II and a second portion of the isolation region III may be removed, to form the first work function layer 270 in the opening 251 over the first region I and a first portion of the isolation region III.

The first work function layer 270 may be configured to adjust a threshold voltage of a transistor formed over the first region I.

Removing the initial first work function layer 261 over the second region II and the second portion of the isolation region III may include: forming a first patterned layer (not shown in the Figure) on the surface of the initial first work function layer 261, where the first patterned layer may expose a surface of the initial first work function layer 261 over the second region II and the second portion of the isolation region III; and using the first patterned layer as a mask, etching the initial first work function layer 261 until the surfaces of the second fin 212 and the third fin 213 are exposed, to form the first work function layer 270.

In one embodiment, the high-K dielectric layer 252 may be formed on the surfaces of the first fin 211, the second fin 212, and the third fin 213. The process of etching the initial first work function layer 261 may stop until the surface of the high-K dielectric layer 252 over the second fin 212 and the third fin 213 is exposed.

It should be noted that after the first work function layer 270 is formed, the opening 251 may expose the surfaces of the second fin 212 and a second portion of the third fin 213, and the second work function material film may be subsequently filled in the opening 251.

Returning to FIG. 14, after forming the first work function layer, a second work function layer may be formed in the opening over the second region and the second portion of the isolation region (S110). FIG. 13 illustrates a corresponding semiconductor structure.

Referring to FIG. 13, after forming the first work function layer 270, a second work function material film (not shown in the Figure) may be formed on the surface of the first work function layer 270, on the surface of the dielectric layer 250, and in the opening 251. The second work function material film may be planarized until the surface of the dielectric layer 250 is exposed, to form the second work function layer 280 in the opening 251 over the second region II and the second portion of the isolation region III.

The second work function layer 280 may be configured to adjust a threshold voltage of a transistor formed over the second region II.

It should be noted that the formed first work function layer 270 may expose the surfaces of the second fin 212 and the second portion of the third fin 213, such that the formed second work function material film may be located on the surfaces of the second fin 212 and the second portion of the third fin 213.

The first region I and the second region II may be configured to form devices of different conductivity types, respectively. The work function type of the first work function layer 270 may be different from the work function type of the second work function layer 280.

The second work function layer 280 may be made of a material including one or more of TiN, TaN and TiAl.

In one embodiment, the device over the second region II may be configured to form a P-type device. The second work function layer 280 may have a four-layer structure formed by sequentially stacking TiN, TaN, TiN, and TiAl layers with different thicknesses. In another embodiment, the second work function layer may have a four-layer structure formed by sequentially stacking TaN, TiN, TaN, and TiAl layers with different thicknesses.

In certain embodiments, the device over the second region II may be configured to form an N-type device. The second work function layer may be made of a material including one or more of TiN, TaN and TiAl.

An interface C where the first work function layer 270 is in contact with the second work function layer 280 may be located over the top surface of the third fin 213.

In one embodiment, the gate structure (not marked in the Figure) may include: the high-K dielectric layer 252 located on a portion of the top surfaces and sidewall surfaces of the first fin 211, the second fin 212, and the third fin 213. The gate structure may also include the first work function layer 270 located on the surface of a portion of the high-K dielectric layer 252, and the first work function layer 270 may be across the first region I and the first portion of the isolation region III. Further, the gate structure may include the second work function layer 280 located on the surface of another portion of the high-K dielectric layer 252, and the second work function layer 280 may be across the second region II and the second portion of the isolation region III.

In certain embodiments, forming the gate structure may further include before forming the high-K dielectric layer, forming an interface layer on the exposed surfaces of the first fin, the second fin, and the third fin. The interface layer may be located at the bottom of the high-K dielectric layer.

The interface layer may be configured to improve the surface defects of the first fin, the second fin and the third fin, thereby improving the interface state between the gate structure and each of the first fin, the second fin and the third fin, which may facilitate to improve the performance of the formed semiconductor structure.

In certain embodiments, forming the gate structure may further include after forming the first work function layer and the second work function layer, forming a first conductive layer on the first work function layer, and forming a second conductive layer on the second work function layer.

The first region I and the second region II may be configured to form transistors of different conductivity types, respectively. The first fin 211 may be formed over the first region I, the second fin 212 may be formed over the second region II, and the third fin 213 may be formed over the isolation region III. Because the isolation region III is located between the first region I and the second region II, the third fin 213 formed over the isolation region III may block the first work function layer 270 from the second work function layer 280, may reduce the mutual influence between the first work function layer 270 and the second work function layer 280, thereby maintaining the stability of the threshold voltage of the transistor over the first region I and the stability of the threshold voltage of the transistor over the second region II.

Accordingly, the present disclosure also provides a semiconductor structure. Referring to FIG. 13, the semiconductor structure may include a substrate 200. The substrate 200 may include a first region I, a second region II, and an isolation region III disposed between the first region I and the second region II. The semiconductor structure may also include a first fin 211 disposed over the first region I, a second fin 212 disposed over the second region II, and a third fin 213 disposed over the isolation region III. Moreover, the semiconductor structure may include a gate structure (not marked in the Figure) across the first fin 211, the second fin 212 and the third fin 213. The gate structure may include a first work function layer 270 disposed over the first region I and a first portion of the isolation region III, and a second work function layer 280 disposed over the second region II and a second portion of the isolation region III. An interface C where the first work function layer 270 is in contact with the second work function layer 280 may be located over the top surface of the third fin 213.

The first region I and the second region II may be configured to form transistors of different conductivity types, respectively. The first fin 211 may be formed over the first region I, the second fin 212 may be formed over the second region II, and the third fin 213 may be formed over the isolation region III. Because the isolation region III is located between the first region I and the second region II, the third fin 213 formed over the isolation region III may block the first work function layer 270 from the second work function layer 280, may reduce the mutual influence between the first work function layer 270 and the second work function layer 280, thereby maintaining the stability of a threshold voltage of a transistor over the first region I and the stability of a threshold voltage of a transistor over the second region II.

Referring to FIG. 4, the first fin 211 close to the isolation region III and the third fin 213 may be spaced apart by a first distance L1, and the second fin 212 close to the isolation region III and the third fin 213 may be spaced apart by a second distance L2, where the first distance L1 may be equal to the second distance L2. Therefore, the effect of the first work function layer 270 on the second work function layer 280 may be similar to the effect of the second work function layer 280 on the first work function layer 270, which may facilitate to maintain the stability of the threshold voltage of the transistor over the first region I and the stability of the threshold voltage of the transistor over the second region II.

A top surface of the first work function layer 270 may be above a top surface of each of the first fin 211, the second fin 212, and the third fin 213. The top surface of the first work function layer 270 may be higher than the top surface of each of the first fin 211, the second fin 212, and the third fin 213 in a range of approximately 10 nm-30 nm.

A top surface of the second work function layer 280 may be above the top surface of each of the first fin 211, the second fin 212, and the third fin 213. The top surface of the second work function layer 280 may be higher than the top surface of each of the first fin 211, the second fin 212, and the third fin 213 in a range of approximately 10 nm-30 nm.

The top surface of the first work function layer 270 may be higher than the top surface of each of the first fin 211, the second fin 212, and the third fin 213 in a range of approximately 10 nm-30 nm. Therefore, the first work function layer 270 and the second work function layer 280 may have a certain contact area, and the first work function layer 270 may be electrically connected to the second work function layer 280, to satisfy that the transistor over the first region I and the transistor over the second region II may form a CMOS device. At the same time, the contact area between the first work function layer 270 and the second work function layer 280 may not be too large, thereby reducing the mutual influence between the first work function layer 270 and the second work function layer 280, and maintaining the stability of the threshold voltage of the transistor over the first region I and the stability of the threshold voltage of the transistor over the second region II.

Similarly, the top surface of the second work function layer 280 may be higher than the top surface of each of the first fin 211, the second fin 212, and the third fin 213 in a range of approximately 10 nm-30 nm, and the meaning may be the same as the first work function layer 270.

In one embodiment, the top surface of the first work function layer 270 may be coplanar with the top surface of the second work function layer 280. A central axis H of the third fin 213 may coincide with the interface C.

A work function type of the first work function layer 270 may be different from a work function type of the second work function layer 280.

The first work function layer 270 may be made of a material including one or more of TiN, TaN and TiAl. The second work function layer 280 may be made of a material including one or more of TiN, TaN and TiAl.

In one embodiment, the device over the first region I may be configured to form an N-type device. The first work function layer 270 may have a three-layer structure formed by sequentially stacking TiN, TaN, and TiAl layers with different thicknesses.

In one embodiment, the device over the second region II may be configured to form a P-type device. The second work function layer 280 may have a four-layer structure formed by sequentially stacking TiN, TaN, TiN, and TiAl layers with different thicknesses.

In certain embodiments, the gate structure may further include a first conductive layer over the first work function layer 270, and a second conductive layer over the second work function layer 280. The first conductive layer may be made of a material including one or more of copper, tungsten, aluminum, titanium, nickel, titanium nitride, and tantalum nitride. The second conductive layer may be made of a material including one or more of copper, tungsten, aluminum, titanium, nickel, titanium nitride, and tantalum nitride.

The semiconductor structure may further include a first source and drain doped region 241 in the first fin 211 on each side of the first work function layer 270, and a second source and drain doped region 242 in the second fin 212 on each side of the second work function layer 280.

The semiconductor structure may further include an isolation layer 220 over the substrate 200. The isolation layer 220 may cover a portion of the sidewall surface of each of the first fin 211, the second fin 212, and the third fin 213, and both the first work function layer 270 and the second work function layer 280 may be disposed over the isolation layer 220.

The semiconductor structure may further include a dielectric layer 250 disposed over the isolation layer 220. The dielectric layer 250 may be disposed on the sidewalls of the first fin 211, the second fin 212, and the third fin 213, and may expose the top surfaces of the first work function layer 270 and the second work function layer 280. The dielectric layer may include an opening 251 across the first region I, the second region II, and the isolation region III. The opening 251 may expose a portion of the top surface and sidewall surface of each of the first fin 211, the second fin 212 and the third fin 213. The gate structure may be disposed in the opening 251. The semiconductor structure may further include a high-K dielectric layer 252 disposed on the bottom and sidewall surfaces of the opening 251. The high-K dielectric layer 252 may be located between the first work function layer 270 and each of the first fin 211 and the third fin 213, and between the second work function layer 280 and each of the second fin 212 and the third fin 213.

The disclosed embodiments may have following beneficial effects. In the disclosed semiconductor structure of the present disclosure, the first region and the second region may be configured to form transistors of different conductivity types, respectively. The first fin may be formed over the first region, the second fin may be formed over the second region, and the third fin may be formed over the isolation region. Because the isolation region is located between the first region and the second region, the third fin formed over the isolation region may block the first work function layer from the second work function layer, may reduce the mutual influence between the first work function layer and the second work function layer, thereby maintaining the stability of the threshold voltage of the transistor over the first region and the stability of the threshold voltage of the transistor over the second region.

Further, the first fin close to the isolation region and the third fin may be spaced apart by a first distance, and the second fin close to the isolation region and the third fin may be spaced apart by a second distance, where the first distance may be equal to the second distance. Therefore, the effect of the first work function layer on the second work function layer may be similar to the effect of the second work function layer on the first work function layer, which may facilitate to maintain the stability of the threshold voltage of the transistor over the first region and the stability of the threshold voltage of the transistor over the second region.

Further, the top surface of the first work function layer may be higher than the top surface of each of the first fin, the second fin, and the third fin in a range of approximately 10 nm-30 nm. Therefore, the first work function layer and the second work function layer may have a certain contact area, and the first work function layer may be electrically connected to the second work function layer, to satisfy that the transistor over the first region and the transistor over the second region may form a CMOS device. At the same time, the contact area between the first work function layer and the second work function layer may not be too large, thereby reducing the mutual influence between the first work function layer and the second work function layer, and maintaining the stability of the threshold voltage of the transistor over the first region and the stability of the threshold voltage of the transistor over the second region. Similarly, the top surface of the second work function layer may be higher than the top surface of each of the first fin, the second fin, and the third fin in a range of approximately 10 nm-30 nm, and the meaning may be the same as the first work function layer.

In the disclosed fabrication method of the present disclosure, the first region and the second region may be configured to form transistors of different conductivity types, respectively. The first fin may be formed over the first region, the second fin may be formed over the second region, and the third fin may be formed over the isolation region. Because the isolation region is located between the first region and the second region, the third fin formed over the isolation region may block the first work function layer from the second work function layer, may reduce the mutual influence between the first work function layer and the second work function layer, thereby maintaining the stability of the threshold voltage of the transistor over the first region and the stability of the threshold voltage of the transistor over the second region.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
    a substrate, wherein the substrate comprises a first region, a second region, and an isolation region disposed between the first region and the second region;
    a first fin disposed over the first region, a second fin disposed over the second region, and a third fin disposed over the isolation region;
    a high-K dielectric layer disposed on top and sidewall surfaces of the first fin, the second fin, and the third fin; and
    a gate structure on the high-K dielectric layer and across the first fin, the second fin, and the third fin, wherein:
    the gate structure comprises a first work function layer disposed over the first region and a first portion of the isolation region, and a second work function layer disposed over the second region and a second portion of the isolation region, and
    an interface where the first work function layer is in direct contact with the second work function layer is located over a top surface of the high-K dielectric layer on the top surface of the third fin.

2. The semiconductor structure according to claim 1, wherein:
    the first fin close to the isolation region and the third fin are spaced apart by a first distance, and the second fin close to the isolation region and the third fin are spaced apart by a second distance, wherein the first distance is equal to the second distance.

3. The semiconductor structure according to claim 1, wherein:
    a top surface of the first work function layer is above a top surface of each of the first fin, the second fin, and the third fin, and
    the top surface of the first work function layer is higher than the top surface of each of the first fin, the second fin, and the third fin in a range of approximately 10 nm-30 nm.

4. The semiconductor structure according to claim 1, wherein:
    a top surface of the second work function layer is above a top surface of each of the first fin, the second fin, and the third fin, and
    the top surface of the second work function layer is higher than the top surface of each of the first fin, the second fin, and the third fin in a range of approximately 10 nm-30 nm.

5. The semiconductor structure according to claim 1, wherein:
    a central axis of the third fin coincides with the interface.

6. The semiconductor structure according to claim 1, wherein:
    a work function type of the first work function layer is different from a work function type of the second work function layer,
    the first work function layer is made of a material comprising one or more of TiN, TaN and TiAl, and
    the second work function layer is made of a material comprising one or more of TiN, TaN and TiAl.

7. The semiconductor structure according to claim 6, wherein:
    the gate structure further comprises a first conductive layer disposed over the first work function layer, and a second conductive layer disposed over the second work function layer.

8. The semiconductor structure according to claim 1, further comprising:
    a first source and drain doped region in the first fin on each side of the first work function layer, and
    a second source and drain doped region in the second fin on each side of the second work function layer.

9. The semiconductor structure according to claim 1, further comprising:
    an isolation layer disposed over the substrate, wherein the isolation layer covers a portion of a sidewall surface of each of the first fin, the second fin, and the third fin, and both the first work function layer and the second work function layer are disposed over the isolation layer.

10. The semiconductor structure according to claim 9, further comprising:
    a dielectric layer disposed over the isolation layer, wherein:
    the dielectric layer is disposed on sidewalls of the first fin, the second fin, and the third fin, and exposes top surfaces of the first work function layer and the second work function layer, and
    the dielectric layer contains an opening across the first region, the second region, and the isolation region, the opening exposes a portion of top and sidewall surfaces of each of the first fin, the second fin and the third fin, and the gate structure is disposed in the opening.

11. A fabrication method of a semiconductor structure, comprising:
    providing a substrate, wherein the substrate comprises a first region, a second region, and an isolation region disposed between the first region and the second region;
    forming a first fin, a second fin, and a third fin over the first region, the second region, and the isolation region, respectively;
    forming a high-K dielectric layer on top and sidewall surfaces of the first fin, the second fin, and the third fin; and
    forming a gate structure on the high-K dielectric layer and across the first fin, the second fin, and the third fin, wherein:
    the gate structure comprises a first work function layer disposed over the first region and a first portion of the isolation region, and a second work function layer disposed over the second region and a second portion of the isolation region, and
    an interface where the first work function layer is in direct contact with the second work function layer is located over a top surface of the high-K dielectric layer on the top surface of the third fin.

12. The method according to claim 11, before forming the first work function layer and the second work function layer, further comprising:
- forming an isolation layer covering a portion of a sidewall surface of each of the first fin, the second fin, and the third fin over the substrate; and
- forming a dielectric layer over the isolation layer, wherein the dielectric layer contains an opening across the first region, the second region, and the isolation region, and the opening exposes a portion of top and sidewall surfaces of each of the first fin, the second fin and the third fin.

13. The method according to claim 12, wherein:
- after forming the first work function layer, the second work function layer is formed, or
- before forming the first work function layer, the second work function layer is formed.

14. The method according to claim 13, wherein forming the first work function layer and the second work function layer comprises:
- forming a first work function material film in the opening and on a surface of the dielectric layer,
- planarizing the first work function material film until the surface of the dielectric layer is exposed, to form an initial first work function layer in the opening,
- removing the initial first work function layer over the second region and the second portion of the isolation region, to form the first work function layer in the opening over the first region and the first portion of the isolation region,
- forming a second work function material film on a surface of the first work function layer, on the surface of the dielectric layer, and in the opening, and
- planarizing the second work function material film until the surface of the dielectric layer is exposed, to form the second work function layer in the opening over the second region and the second portion of the isolation region.

15. The method according to claim 14, wherein removing the initial first work function layer over the second region and the second portion of the isolation region comprises:
- forming a first patterned layer on a surface of the initial first work function layer, wherein the first patterned layer exposes the surface of the initial first work function layer over the second region and the second portion of the isolation region; and
- using the first patterned layer as a mask, etching the initial first work function layer until surfaces of the second fin and the third fin are exposed, to form the first work function layer.

16. The method according to claim 12, wherein forming the dielectric layer and the opening in the dielectric layer comprises:
- forming a dummy gate structure across the first fin, the second fin and the third fin over the isolation layer,
- forming the dielectric layer over the isolation layer, wherein the dielectric layer is disposed on a sidewall surface of the dummy gate structure, and
- removing the dummy gate structure to form the opening in the dielectric layer.

17. The method according to claim 16, after forming the dummy gate structure and before forming the dielectric layer, further comprising:
- forming a first source and drain doped region in the first fin on each side of the dummy gate structure; and
- forming a second source and drain doped region in the second fin on each side of the dummy gate structure.

18. The method according to claim 17, wherein forming the first source and drain doped region comprises:
- forming a second patterned layer over the substrate, wherein the second patterned layer covers the second fin and the third fin, and exposes the first fin;
- etching the first fin using the second patterned layer as a mask, to form a first source and drain opening in the first fin on each side of the dummy gate structure; and
- forming the first source and drain doped region in the first source and drain opening.

19. The method according to claim 17, wherein forming the second source and drain doped region comprises:
- forming a third patterned layer over the substrate, wherein the third patterned layer covers the first fin and the third fin, and exposes the second fin;
- etching the second fin using the third patterned layer as a mask, to form a second source and drain opening in the second fin on each side of the dummy gate structure; and
- forming the second source and drain doped region in the second source and drain opening.

20. The method according to claim 12, wherein:
- forming the first fin, the second fin and the third fin comprises a multiple self-aligned patterning process, or an exposure process using extreme ultraviolet light as a light source.

* * * * *